United States Patent [19]

Eu et al.

[11] 4,407,694
[45] Oct. 4, 1983

[54] MULTI-RANGE DOPING OF EPITAXIAL III-V LAYERS FROM A SINGLE SOURCE

[75] Inventors: Victor K. Eu, Redondo Beach; Milton Feng, Rancho Palos Verdes; Timothy T. Zielinski, Hawthorne; James M. Whelan, Glendale, all of Calif.

[73] Assignee: Hughes Aircraft Company, El Segundo, Calif.

[21] Appl. No.: 276,104

[22] Filed: Jun. 22, 1981

[51] Int. Cl.³ .................. H01L 21/205; H01L 21/223
[52] U.S. Cl. .................................... 156/606; 148/174; 148/175; 156/613; 252/62.3 GA; 252/951; 427/87
[58] Field of Search ............... 148/174, 175; 156/605, 156/606, 613; 252/950, 951, 62.3 GA; 427/85, 87

[56] References Cited

U.S. PATENT DOCUMENTS

| | | | |
|---|---|---|---|
| 3,146,137 | 8/1964 | Williams | 148/175 |
| 3,218,205 | 11/1965 | Ruehrwein | 148/175 |
| 3,471,324 | 10/1969 | Wilson et al. | 148/175 X |
| 3,716,404 | 2/1973 | Hirao et al. | 148/1.5 X |

OTHER PUBLICATIONS

Shaw et al., "Gallium Arsenide Epitaxial Technology", 1966 Symp. on GaAs, Paper No. 2, pp. 10-15.
DiLorenzo, J. V., "Vapor Growth—GaAs—Epitaxial Layers", J. Crystal Growth, vol. 17, 1972, pp. 189-206.
Frieser, R. G., "Low-Temperature Silicon Epitaxy", J. Electrochem. Soc., vol. 115, No. 4, Apr. 1968, pp. 401-405.

Primary Examiner—W. G. Saba
Attorney, Agent, or Firm—David W. Collins; W. J. Bethurum; A. W. Karambelas

[57] ABSTRACT

Silicon doping of GaAs epitaxial layers grown using the $AsCl_3/H_2/GaAs$:Ga CVD system is accomplished using $AsCl_3$:$SiCl_4$ liquid doping solutions. These solutions can be readily prepared with reproducible compositions and provide excellent doping control. Fine adjustments in the doping level can be achieved by adjusting the $H_2$ flow rate and by varying the temperature of the doping solution. Doping levels may range from about $5 \times 10^{15}$ to $5 \times 10^{19}$ cm$^{-3}$ by adjusting the mole fraction of $SiCl_4$ in the doping solution and the $H_2$ flow rate to change the mole fraction of $P_{HCl}$. The epitaxial layers doped using this technique have excellent room temperature and liquid nitrogen mobilities for electron concentrations between $1 \times 10^{16}$ cm$^{-3}$ and $8 \times 10^{18}$ cm$^{-3}$. This doping method is particularly useful for the growth of GaAs epitaxial layers for FET devices.

13 Claims, 6 Drawing Figures

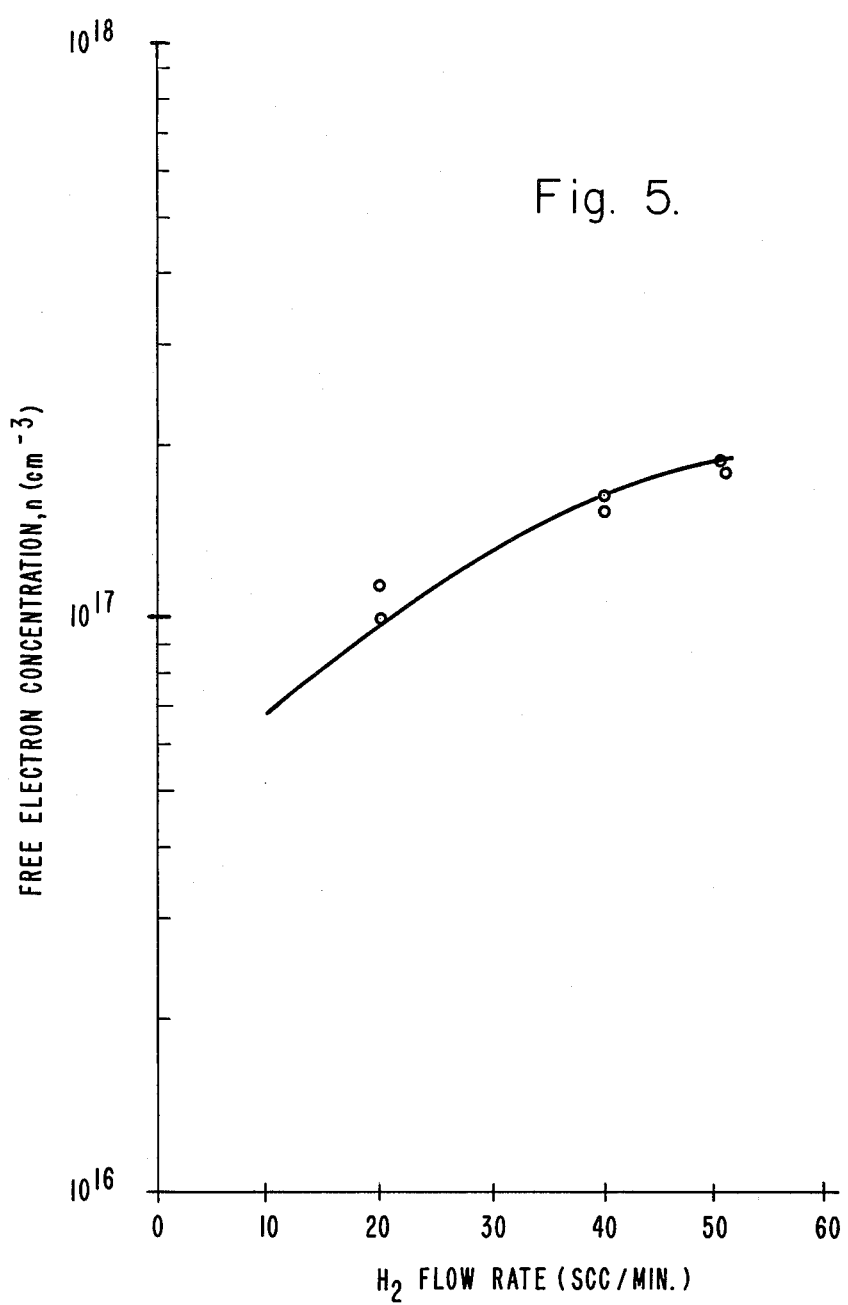

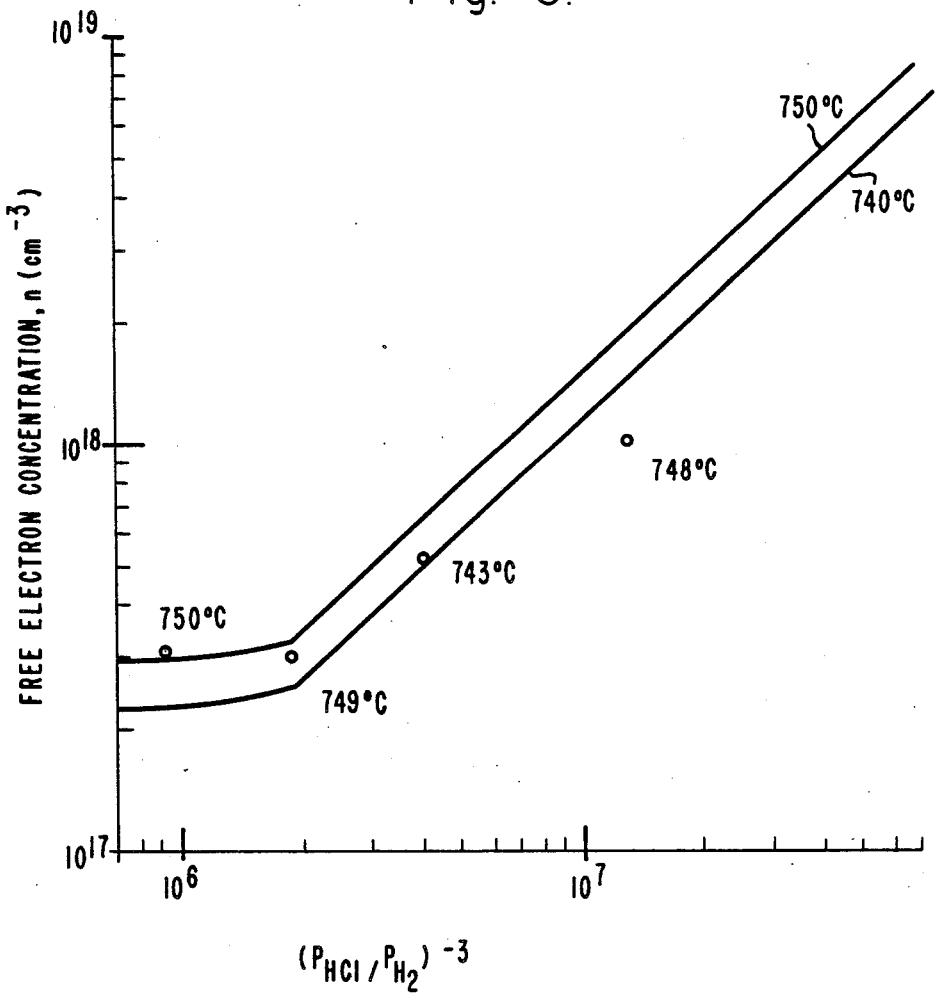

MULTI-RANGE DOPING OF EPITAXIAL III-V LAYERS FROM A SINGLE SOURCE

BACKGROUND OF THE INVENTION

1. Field of the Invention

This invention relates to the epitaxial growth of III-V layers and to the doping thereof, and, more particularly, to the use of a single doping source for providing a wide range of doping concentration.

2. Description of the Prior Art

The $AsCl_3/Ga/H_2$ vapor phase epitaxy (VPE) system has been extensively used for preparing GaAs epitaxial layers for field effect transistor (FET) devices in the past few years. The key to success of device quality GaAs material lies in the ability to control background impurity, surface morphology, thickness and doping. These are strongly influenced by growth conditions such as temperature, substrate orientation, growth rate and the $AsCl_3/H_2$ ratio. The most commonly used n-type dopants in GaAs are sulfur and silicon and these are frequently introduced by means of dilute $H_2S/H_2$ or $SiH_4/H_2$ gaseous mixtures, respectively. Both of these sources are subject to control limitations because of instabilities which limit their shelf life. Additional doping sources include the liquid doping source $S_2Cl_2/AsCl_3$ and solid $SiCl_4$ at $-147°$ C.

The use of gaseous solutions requires the metering of small gas streams, while liquid solutions have heretofore suffered from short shelf life or have not been readily prepared with reproducible compositions.

SUMMARY OF THE INVENTION

In accordance with the invention, a process is provided for establishing a range of doping levels from a single liquid doping source during vapor phase epitaxial growth of a III-IV semiconductor layer under equilibrium conditions using halide or hydride epitaxy growth processes in which the source comprises a solution of (a) a compound selected from the group consisting of arsenic halides and phosphorus halides and (b) a compound selected from the group consisting of silicon halides and germanium halides.

The liquid doping solutions employed in the invention can be readily prepared with reproducible compositions which have long shelf life. These are the essential features required for reproducible doping control. For example, GaAs epitaxial layers grown by use of a $AsCl_3:SiCl_4$ liquid source for silicon doping evidence excellent room temperature and liquid nitrogen mobilities (1,200 to 5,600 cm$^2$/V-s and 1,500 to 21,100 cm$^2$/V-s, respectively) for electron concentrations between $5 \times 10^{16}$ cm$^{-3}$ and $8 \times 10^{18}$ cm$^{-3}$.

BRIEF DESCRIPTION OF THE DRAWING

FIG. 5, on coordinates of free electron concentration in cm$^{-3}$ and $H_2$ flow rate in scc/min, depicts the free carrier concentration as a function $H_2$ flow rate through the doping bubbler with the latter maintained at 10° C.; and FIG. 6, on coordinates of free electron concentration and partial pressure ratio, depicts the free carrier concentration as a function of the $HCl/H_2$ partial pressure ratios.

DETAILED DESCRIPTION OF THE INVENTION

Disclosed herein is a process for adjusting the silicon doping level in epitaxial layers of gallium arsenide grown by using the $AsX_3/H_2/GaAs:Ga$ process with a single $AsX_3:Si-X$ liquid doping source, where X is an element selected from the group consisting of chlorine and bromine, and preferably chlorine, and where Si-X is a silicon halide, preferably $SiCl_4$. However, it will be appreciated that other III-V compounds, such as GaP, InAs and InP, and mixed III-V compounds such as (In,Ga)As and (In,Ga)(As,P), may also be doped employing a single doping source, using a V-halide compound. Further, other dopants, such as germanium, may also be used to dope III-V compounds, employing suitable halides of such dopant species.

The following description sets forth a GaAs epitaxial doping/growth schedule which permits a convenient, rapid and reproducible method for adjusting the free electron concentration in the growing GaAs source to produce multi-layered epitaxial films in which each layer is characterized by its electron concentration with abrupt differences between adjacent layers. The process utilizes the epitaxial growth system commonly described as the $AsCl_3/H_2/GaAs:Ga$ system and a novel silicon doping procedure employing a novel liquid doping source comprising $AsCl_3:SiCl_4$.

Figure 1:
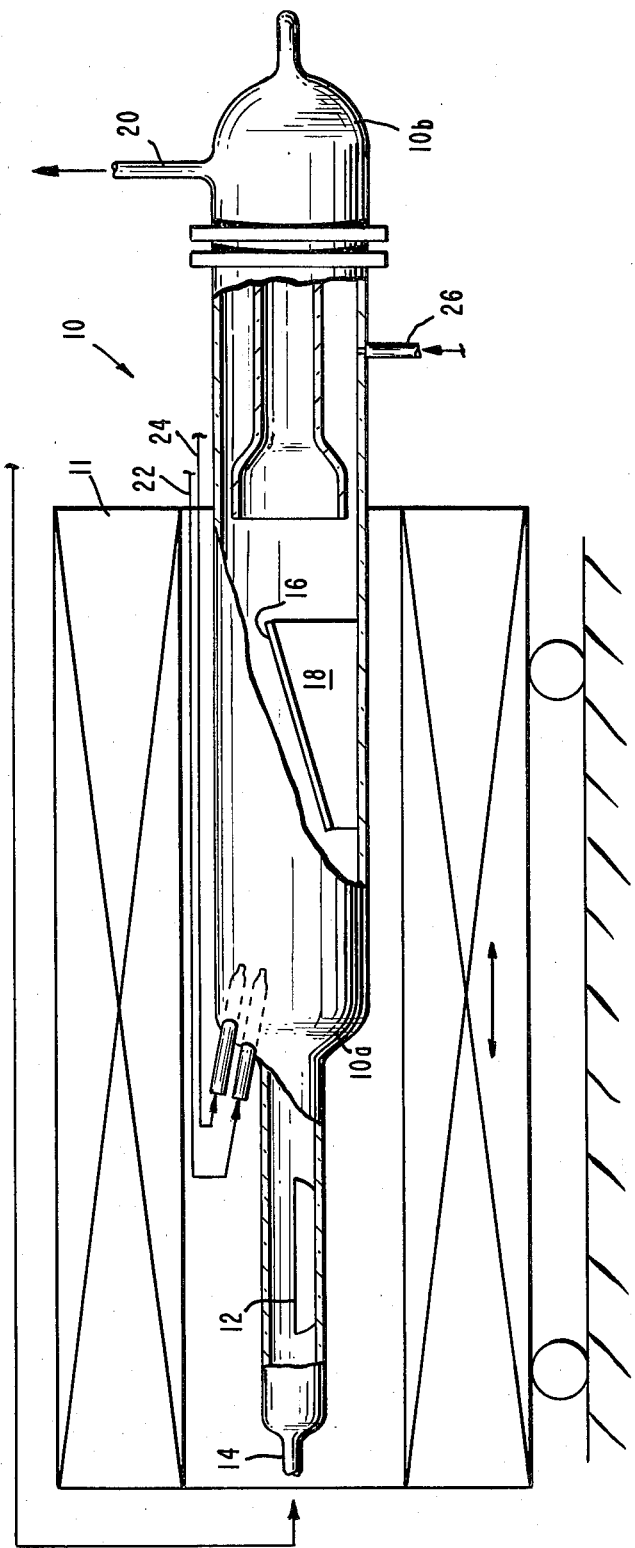
FIG. 1 is a semi-diagrammatic view of a reactor suitably employed in the practice of the invention.

Shown in FIG. 1 is a substantially conventional reactor 10 comprising rector tube 10a and dump tube 10b, which can be surrounded with a conventional tube furnace 11. Nonreactive gases are employed herein as carrier or transport gases, for example, $H_2$ or $N_2$ or a mixture thereof. However, it will be appreciated that hydrogen is present in the reactor, whether added alone or as a transport gas.

At one end of the furnace is located a source 12 of gallium. An input 14 permits introduction of a transport gas of which passes over the gallium and gallium arsenide crust and from there to a substrate 16 of GaAs, secured on support 18 (halide system). Alternatively, a transport gas of HCl and non-reactive gas could be passed over a gallium source; $AsH_3$ would be added downstream of the gallium source (hydride process). The corresponding phosphorus compounds may be added in partial or full replacement of arsenic compounds in either of the above reactions to incorporate phosphorus in the epitaxial film. An exhaust outlet 20 is provided, together with etching gas input 22 and doping gas input 24. The temperature profile in the furnace is that customarily employed in the art. A backflow inlet 26 is also provided in order to prevent deposition of GaAs on the (relatively cold) portion of the reactor outside the furnace.

Figure 2:
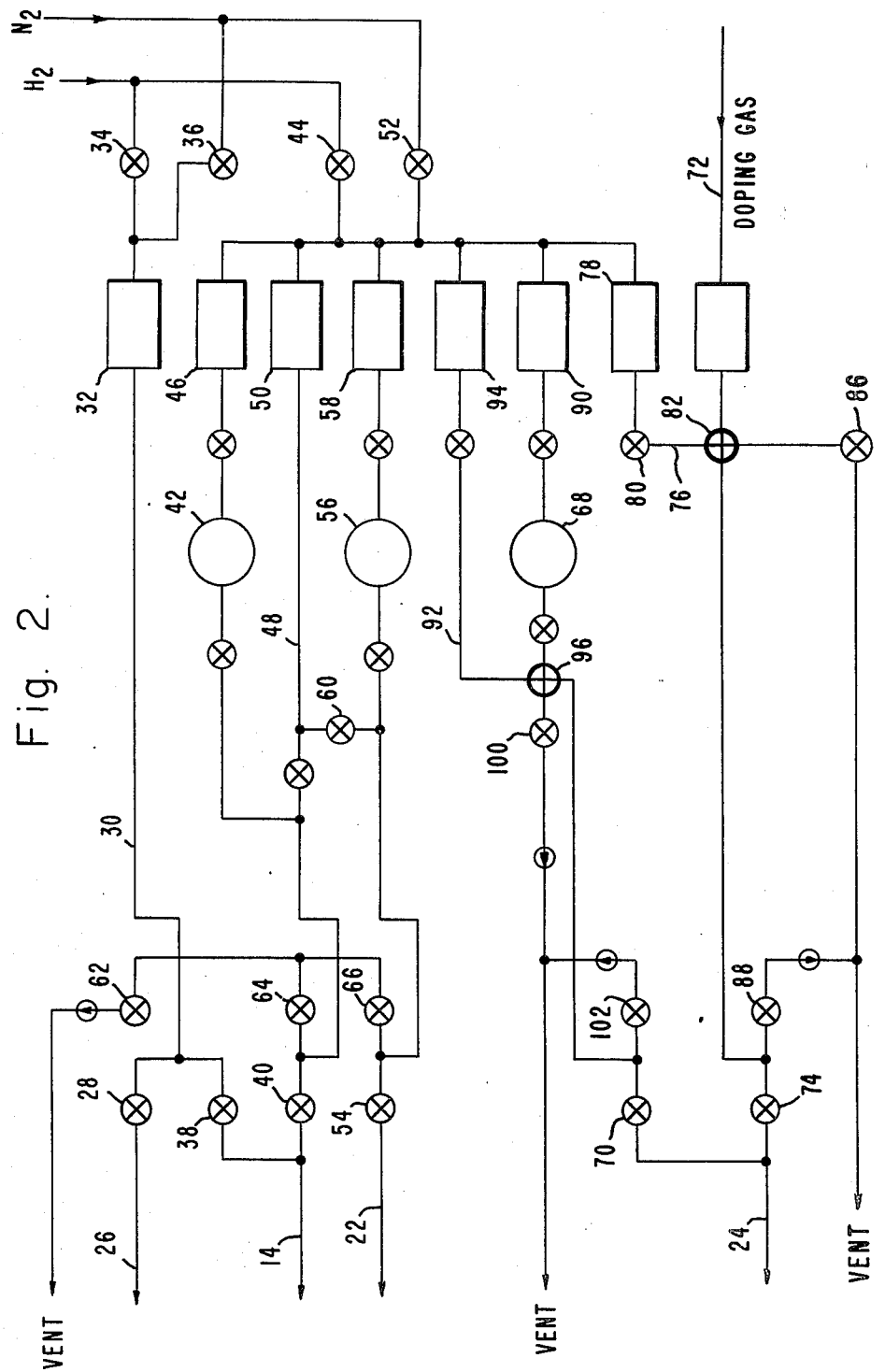
FIG. 2 is a system diagram showing gas flow paths and controls for the reactor of FIG. 1.

Referring to FIG. 2, a backflow of non-reactive gas is provided to inlet 26 by valve 28, which is fed by line 30 from automatic flow control 32. Valves 34 and 36 control the input of hydrogen and nitrogen, respectively.

The reactor may be flushed by providing a non-reactive flush gas from line 30, through valve 38 and introduced at input 14.

Growth is initiated by introducing at input 14 AsCl$_3$ entrained on hydrogen and/or nitrogen through valve 40. Hydrogen is introduced to AsCl$_3$ bubbler 42 through valve 44 and automatic flow control 46. A dilution line 48 is provided through automatic flow control 50, which permits mixture of hydrogen (through valve 44) and/or nitrogen (through valve 52) with the entrained AsCl$_3$.

Etching of the substrate 16 is accomplished by introducing at input 22 AsCl$_3$ (or PCl$_3$) entrained on hydrogen and/or nitrogen through valve 54. Hydrogen is introduced to bubbler 56 through valve 44 and automatic flow control 58. Connection with dilution line 48 is via valve 60. Nitrogen is introduced via valve 52. Valves 62, 64 and 66 provide venting as desired.

A doping gas is introduced to input 24 and may be from a liquid source from bubbler 68 through valve 70 or from a gaseous source 72 through valve 74. A dilution line 76 is provided for the gaseous doping source, to mix hydrogen and/or nitrogen, controlled by automatic flow control 78 and valve 80, through 4-way quartz junction 82. Venting is accomplished by valves 86 or 88, as appropriate.

The liquid doping source, which in the preferred embodiment comprises AsCl$_3$:SiCl$_4$, is entrained on hydrogen and/or nitrogen, introduced through automatic flow control 90. A dilution line 92 is provided through automatic flow control 94 for supplying a source of hydrogen and/or nitrogen to controllably dilute the entrained liquid dopant. A 4-way quartz junction 96 permits mixing the diluent gas with the entrained dopant. Venting is accomplished by valves 100 or 102, as appropriate.

The doping procedure of the invention provides controlled silicon doping of epitaxial GaAs layers during their growth. Being able to provide different free electron concentrations in sequential epitaxial layers using a single doping solution is highly desirable. This is so because (a) larger concentration differences are needed for microwave and optical devices, both current and projected, and (b) the use of a single doping solution simplifies the required control and repeatability of the growth schedules.

A major advantage provided by the invention is the determination that free electron concentrations in the epitaxial layers can be changed by a factor of six or more with a single doping solution. For a given hydrogen fugacity, changing the partial pressure of HCl permits changing the electron concentration by as much as a factor of 40 to 50 or more using a single AsCl$_3$:SiCl$_4$ liquid doping source.

The reasons that substantial differences in electron concentration can be obtained using a single AsCl$_3$:SiCl$_4$ source operating at a fixed temperature are two-fold. First, satisfactory GaAs epitaxial growth conditions such as growth rate (needed for single layer thickness uniformity and homogeneity) can be obtained with two-fold or more changes in the basic growth conditions. These include the molar flow rates and velocities of H$_2$, HCl, As$_4$ and GaCl gases in that portion of the epitaxial reactor containing the epitaxial layer or layers growing on one or more GaAs substrates. Second, under previously established growth conditions, the silicon concentrations in growing epitaxial layers using a given AsCl$_3$:SiCl$_4$ solution may be described as occurring under near-equilibrium conditions, in contrast to the steady state conditions employed in the prior art. The experimental results obtained indicate that silicon doping under near-equilibrium conditions occurs at normal injection (of H$_2$) as well as when, the molar flow rates (such as increasing flow rate of H$_2$ are changed so as to reduce the mole fraction and partial pressure (more precisely, the fugacity) of HCl in the gas stream flowing past the growing GaAs. This results from an agreement of the observed free electron concentration with that estimated from calculations based upon the assumption of near-equilibrium. The significance of varying the HCl partial pressure under these circumstances is illustrated by the following dopant reaction:

$$SiHCl_3(g) + H_2(g) = Si(in\ GaAs) + 3HCl(g). \tag{1}$$

Under equilibrium conditions, the relationship between the silicon concentration, $N_{Si}$, in the GaAs and the partial pressures of SiHCl$_3$ (the prime vapor species upon injection of SiCl$_4$ into the reactor), H$_2$ and HCl is:

$$K_1 = (P^3_{HCl} N_{Si})/(P_{SiHCl_3} P_{H_2}) \tag{2}$$

The value of $K_1$ in Eqn. 2 varies with the growth temperature only. The key factor is the strong dependence of $N_{Si}$ on $P_{HCl}$. Decreasing the value of $P_{HCl}$ by a factor of two and keeping the other partial pressures constant causes an eight-fold increase in $N_{Si}$. Actually, a two-fold decrease causes a somewhat smaller increase in $N_{Si}$ because it also causes a redistribution of the relative amounts of Si halides. However, appropriate three-fold changes in the injected rates of SiCl$_4$ and partial pressures of HCl would be expected to cause a change in $N_{Si}$ by a factor close to 40 to 50 by increasing the molar flow rates of H$_2$ and dopant mixture by a factor of three each. Such changes are deemed to be feasible while maintaining satisfactory growth conditions with respect to growth rate and morphology. Convenient and repeatable control means for adjusting the values of $P_{HCl}$ and $P_{SiHCl_3}$ in the growth zone include varying the H$_2$ flow rate and the composition of the AsCl$_3$/H$_2$ inlet stream which passes over the GaAs:Ga source, the inject rates of H$_2$ and AsCl$_3$ between the source and growing GaAs and the H$_2$ flow rate through the AsCl$_3$:SiCl$_4$ liquid doping solution.

In operation, a substrate 16 is placed in reactor 10, which is flushed a with non-reactive gas such as hydrogen and/or nitrogen gas while the furnace is brought up to temperature (typically about 850° C., with the substrate at about 750° C.).

A mixture of AsCl$_3$ entrained on H$_2$ is passed over the gallium source 12 to initiate growth of an undoped buffer layer of GaAs. The growth bubbler 42 is operated at about 50 to 400 scc/min and maintained at about −20° to +20° C. The etch bubbler 56 is operated at about 10 to 100 scc/min and maintained at about the same temperature as the growth bubbler. The etch bubbler introduces HCl at input 22 to reduce the growth rate of GaAs and to improve the surface morphology. The process is continued for about 20 to 60 min to grow a layer about 3 to 4 μm thick.

At the appropriate time, the doping bubbler, which is operated at about 20 to 50 scc/min and maintained at about −20° to +20° C., is opened to the system. The doping bubbler contains a mixture of AsCl$_3$ and SiCl$_4$, for example, 15 cm$^3$ of a third aliquot of SiCl$_4$ in AsCl$_3$ plus 100 g AsCl$_3$, where an aliquot comprises 10 cm$^3$ of SiCl$_4$ (or subsequent aliquot) plus 100 g AsCl$_3$. This concentration permits doping over a range of about $5 \times 10^{16}$ to $5 \times 10^{19}$ Si/cm$^3$ chemically, as evidenced by secondary ion mass spectroscopy (SIMS). The desired doping concentration is simply attained by controlling H$_2$ flow rate through the doping bubbler, the temperature of the doping bubbler and SiCl$_4$ concentration in the doping solution. Alternatively, to increase the doping concentration, hydrogen is added via lines 48 and 92. This has the effect of decreasing the partial pressure of HCl.

The reactor is then cooled to room temperature, and the substrate, with the undoped epitaxial buffer layer and one or more doped epitaxial layers formed thereon, is removed for additional processing.

The doping source and procedure of the invention permit obtaining a substantially abrupt transition between layers, which is accomplished by suitable addition of H$_2$.

These considerations are applicable for doping all III-V semiconductors and their alloys which are grown using halide or hydride epitaxy processes. In this connection, other halides such as HBr may alternatively be used and other doping sources such as Si$_2$Cl$_6$, which has a vapor pressure close to that of AsCl$_3$, and SiHCl$_3$ may alternatively be used.

The AsCl$_3$:SiCl$_4$ liquid doping solution can be adjusted to any desired composition. For convenience, the mole fraction of SiCl$_4$ ranges from about $10^{-1}$ to $10^{-4}$; a suitable example is a solution in which the mole fraction of SiCl$_4$ is $7.25 \times 10^{-4}$. Fine doping control can be achieved by adjusting both the H$_2$ flow rate and the temperature of the AsCl$_3$:SiCl$_4$ doping solution. For example, at 10° C., increasing the flow rate from 20 scc/min to 50 scc/min only increases the electron concentration from 1 to $1.9 \times 10^{17}$ cm$^{-3}$. Thus, the flow rate permits fine control over the doping level, and these flow rate ranges are well within the controllable range of commercial mass flow controllers.

An alternative control method is to adjust the temperature of the dopant solution for a fixed H$_2$ flow through it. Variation of the doping bubbler temperature from $-20°$ C. to $+20°$ C. results in a concentration variation from $4 \times 10^{16}$ to $1.3 \times 10^{17}$ cm$^{-3}$ for the mole fraction given above.

The use of liquid solutions of AsCl$_3$:SiCl$_4$ as Si dopant sources is convenient from several points of points of view. The liquid solution has a long shelf life so long as it is suitably protected from moisture. An H$_2$ stream of about 10 to 50 scc/min is readily equilibrated with the solution and the resultant gas mixture can be directly added to the main reactor without concern for the formation of non-volatile Si products. The use of a AsCl$_3$:SiCl$_4$ solution rather than a pure SiCl$_4$ source greatly eases the need to meter unusually small gas flow rates or to control temperatures within inconvenient ranges. Fine tuning of the dopant bubbler temperature in the H$_2$ flow through the bubbler provides precise controls for the Si concentrations in addition to the coarse control available by adjusting the mole fraction of SiCl$_4$ in the AsCl$_3$ solution. Solutions with SiCl$_4$ mole fractions of about $10^{-3}$ are convenient for making FET epitaxial layers with carrier concentrations of approximately $10^f$cm$^{-3}$. In this manner, high quality epitaxial layers which have excellent room temperature and liquid nitrogen mobilities can be obtained reproducibly.

EXAMPLES

The chemical vapor deposition apparatus used for the growth of buffer/active layers for FET devices was similar to that depicted in FIGS. 1 and 2 and was fairly conventional except that a third bubbler 68 was added which contained the AsCl$_3$:SiCl$_4$ solution. Both the growth and etch AsCl$_3$ bubblers (42 and 56, respectively) were maintained at 10° C., and the H$_2$ flow rate through the AsCl$_3$ growth bubbler was 350 scc/min. The substrate material 16 was Cr-doped semi-insulating GaAs oriented 2° off the (100) toward the (110). The gallium source 12 and substrate 16 temperatures were 810° C. and 735° C., respectively. The growth rate for both doped and undoped layers was approximately 0.08 $\mu$m/min. A typical layer thickness of the combined layers was about 5 $\mu$m and the carrier concentration for undoped compensated buffer layers was less than $1 \times 10^{13}$ cm$^{-3}$. Flow rates of H$_2$ of 20 to 50 scc/min through the doping bubbler were employed and the doping bubbler was maintained at $-20°$ to $+20°$ C. The mole fraction of SiCl$_4$ in the AsCl$_3$:SiCl$_4$ doping bubbler ranged from $1.36 \times 10^{-1}$ to $7.25 \times 10^{-4}$, which was achieved by employing 5 to 50 cm$^3$ of a third aliquot of SiCl$_4$ in AsCl$_3$ plus 100 g AsCl, as well as 5 to 50 cm$^3$ of the second aliquot and of the first aliquot.

Figure 3:
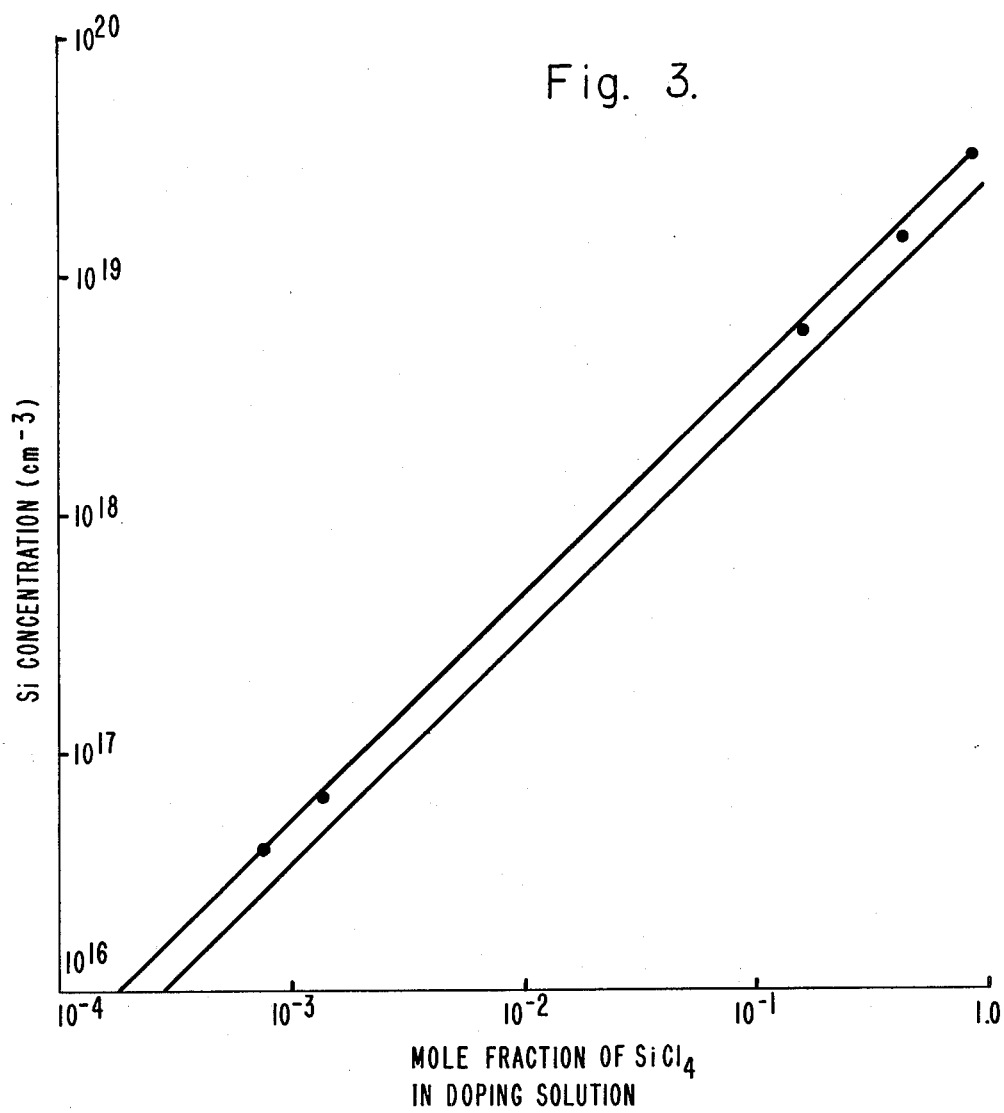
FIG. 3, on coordinates of silicon concentration in cm$^{-3}$ and mole fraction of $SiCl_4$ in $AsCl_3:SiCl_4$, depicts the chemical concentration of silicon in GaAs epitaxial layer as a function of mole fraction of $SiCl_4$ in the doping solution for a flow rate of 20 scc/min and a bubbler temperature of $-20°$ C.

FIG. 3 depicts the chemical concentration of Si in a GaAs epitaxial layer as a function of the mole fraction of SiCl$_4$ in the doping solution. The upper calculated curve is based on the assumption of equilibrium conditions with respect to Si and no depletion of GaCl and formation of HCl at the GaAs substrate due to the growth or the GaAs film. The lower calculated curve is based on the depletion of GaCl and addition of HCl at the GaAs substrate. The experimental points are seen to lie close to the upper curve.

Figure 4:
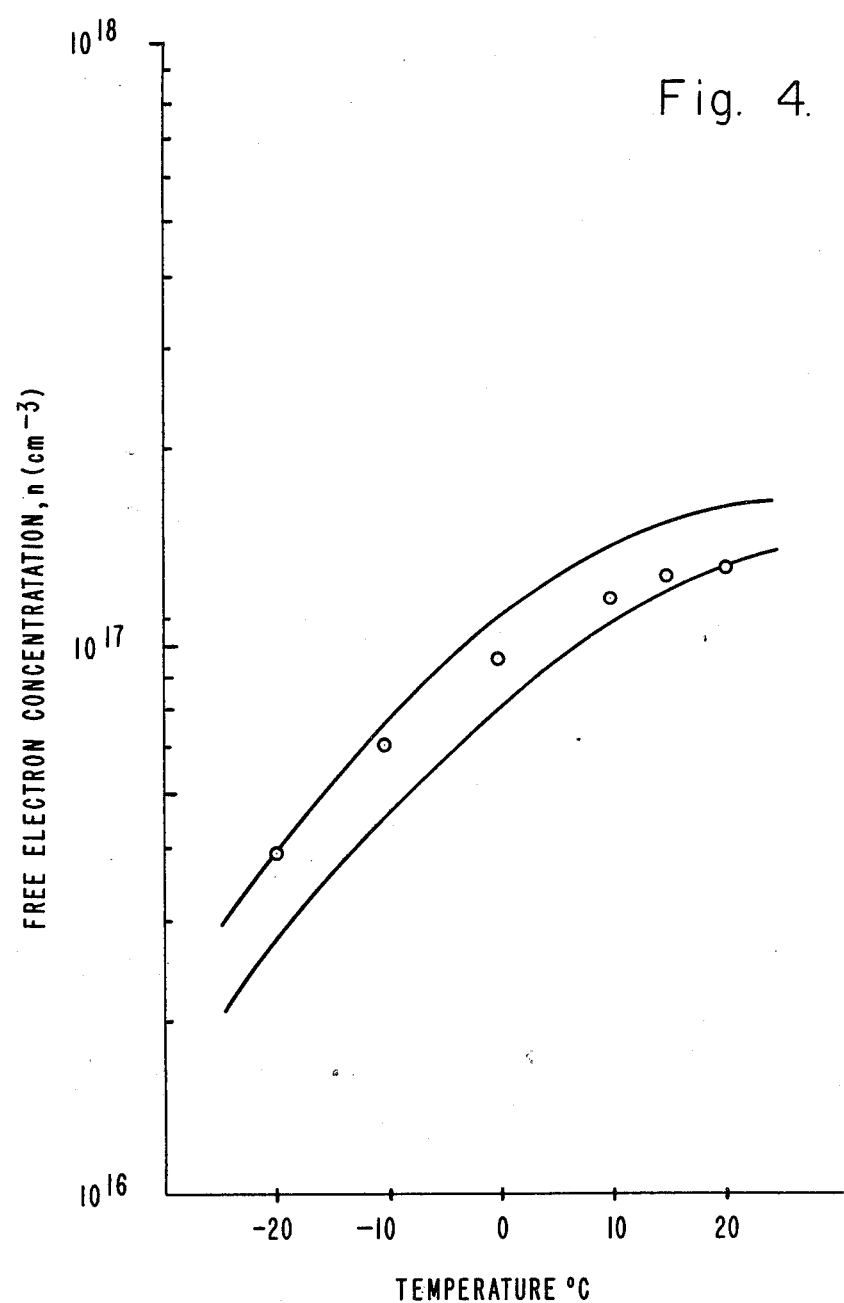
FIG. 4, on coordinates of free electron concentration in cm$^{-3}$ and temperature in °C., depicts the free carrier concentration as a function of temperature of the doping solution for a fixed $H_2$ flow rate of 20 scc/min.

FIGS. 4 and 5 depict the experimental results for a doping solution with mole fraction of $7.25 \times 10^{-4}$. As shown, fine adjustment in doping can be achieved by adjusting both the H$_2$ flow rate and the temperature of the AsCl$_3$:SiCl$_4$ doping solution. FIG. 4 shows the free electron carrier concentration (from C-V measurements) as a function of the temperature of the dopant solution for a fixed H$_2$ flow rate of 20 scc/min. Variation of the doping bubbler temperature from $-20°$ C. to $+20°$ C. resulted in a concentration variation from $4 \times 10^{-16}$ to $1.3 \times 10^{17}$ cm$^{-3}$. The saturation in carrier concentration at high doping bubbler temperatures was caused by the addition of HCl from the doping bubbler. The upper and lower calculated carrier are based on the same assumptions as those in FIG. 3.

FIG. 5 shows the electron concentrations (from C-V measurements) in Si-doped GaAs epitaxial layers as a function of the H$_2$ flow rate through the doping bubbler with the latter maintained at 10° C. Increasing the flow rate from 20 scc/min to 50 scc/min only increased the concentration from 1 to $1.9 \times 10^{17}$ cm$^{-3}$. Thus, flow rate permits fine control of the doping level, and these flow rates are well within the controllable range of commercial mass flow controllers. The calculated curve is based the addition of HCl at the GaAs substrate.

FIG. 6 depicts the results calculated from the free electron carrier concentration as a function of the HCl/H$_2$ partial pressure ratios, resulting from an H$_2$ flow rate through the doping bubbler of 30 scc/min and a mole fraction of SiCl$_4$ in the doping solution of $4.83 \times 10^{-4}$. The computed dependence of the silicon concentration $n_{Si}$ at 740° to 750° C. (substrate temperature) with the fugacity of silicon $\gamma_{Si}$ assumed to be unity agrees well with the experimental results except for Sample 4. This difference may reflect the possible Si self-compensation or a concentration dependence of $\gamma_{Si}$ associated with the conduction band dependency.

Silicon-doped epitaxial layers are only slightly compensated. In the 1 to $3 \times 10^{17}$ cm$^{-3}$ doping range of interest for FET devices, the epitaxial layers evidenced excellent room temperature Hall mobilities of 4,000 to 5,000 cm$^2$/V-s and liquid nitrogen Hall mobilities of 5,800 to 8,600 cm$^2$/V-s.

What is claimed is:

1. A process for providing a range of doping levels from a single doping source using vapor phase epitaxial growth of a III-V semiconductor layer under substantially equilibrium conditions using halide or hydride epitaxy growth process in which the doping source comprises a liquid solution of (a) a compound selected from the group consisting of arsenic halides and phosphorus halides and (b) a compound selected from the group consisting of silicon halides and germanium halides.

2. The process of claim 1 in which the III-V semiconductor layer is one selected from the group consisting of GaAs, GaP, InAs, InP and their alloys.

3. The process of claim 2 in which the III-V semiconductor layer comprises GaAs.

4. The process of claim 3 in which the halide epitaxy process comprises AsX$_3$/H$_2$/GaAs:Ga, where X is an element selected from the group consisting of chlorine and bromine and the doping source comprises AsX$_3$:Si-X, where Si-X is a silicon halide.

5. The process of claim 4 in which X is chlorine.

6. The process of claim 5 in which the doping source comprises AsCl$_3$:SiCl$_4$.

7. The process of claim 6 in which the mole fraction of SiCl$_4$ in AsCl$_3$:SiCl$_4$ ranges from about 10$^{-1}$ to 10$^{-4}$.

8. The process of claim 5 in which the doping source comprises AsCl$_3$:Si$_2$Cl$_6$.

9. The process of claim 5 in which the doping source comprises AsCl$_3$:SiHCl$_3$.

10. A process for doping a III-V semiconductor layer grown by vapor phase epitaxial process under substantially equilibrium conditions from a doping source, characterized in that the doping source consists essentially of a liquid solution of AsCl$_3$ and a silicon chloride compound selected from the group consisting of SiCl$_4$ and Si$_2$Cl$_6$.

11. The process of claim 10 in which the III-V semiconductor layer comprises GaAs.

12. The process of claim 10 in which the silicon chloride compound consists essentially of SiCl$_4$.

13. The process of claim 12 in which the mole fraction of SiCl$_4$ ranges from about 10$^{-1}$ to 10$^{-4}$.

* * * * *

UNITED STATES PATENT AND TRADEMARK OFFICE
CERTIFICATE OF CORRECTION

PATENT NO. : 4,407,694

DATED : October 4, 1983

INVENTOR(S) : Victor K. Eu et al.

It is certified that error appears in the above—identified patent and that said Letters Patent is hereby corrected as shown below:

Column 1, line 57, "semi-diagramatic" instead of "semi-diagrammatic".

Column 5, line 49, "points of", second occurence, delete.

Column 5, line 66, "$10^{17} cm^{-3}$" instead of "$10/cm^{-3}$".

Column 7, line 10, "4,400" instead of "4,000".

Signed and Sealed this

Twenty-ninth Day of January 1985

[SEAL]

Attest:

DONALD J. QUIGG

Attesting Officer     Acting Commissioner of Patents and Trademarks